United States Patent
Teng et al.

(10) Patent No.: US 11,694,943 B2
(45) Date of Patent: *Jul. 4, 2023

(54) SEMICONDUCTOR DEVICE INCLUDING HEAT DISSIPATION STRUCTURE AND FABRICATING METHOD OF THE SAME

(71) Applicant: Taiwan Semiconductor Manufacturing Company, Ltd., Hsinchu (TW)

(72) Inventors: Po-Yuan Teng, Hsinchu (TW); Chen-Hua Yu, Hsinchu (TW); Hao-Yi Tsai, Hsinchu (TW); Kuo-Chung Yee, Taoyuan (TW); Tin-Hao Kuo, Hsinchu (TW); Shih-Wei Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/525,971

(22) Filed: Nov. 15, 2021

(65) Prior Publication Data
US 2022/0077024 A1    Mar. 10, 2022

Related U.S. Application Data

(63) Continuation of application No. 16/533,789, filed on Aug. 7, 2019, now Pat. No. 11,177,192.
(Continued)

(51) Int. Cl.
*H01L 23/473* (2006.01)
*H01L 23/31* (2006.01)
(Continued)

(52) U.S. Cl.
CPC ........ *H01L 23/473* (2013.01); *H01L 21/4857* (2013.01); *H01L 21/4882* (2013.01); *H01L 21/568* (2013.01); *H01L 21/6835* (2013.01); *H01L 23/3121* (2013.01); *H01L 23/4006* (2013.01); *H01L 24/19* (2013.01);
(Continued)

(58) Field of Classification Search
CPC ............... H01L 21/308; H01L 21/3083; H01L 2924/10158; H01L 23/367; H01L 23/473; H01L 23/4006; H01L 23/4037; H01L 23/405; H01L 23/4056; H01L 23/4068; H01L 23/4075; H01L 23/4084; H01L 23/4087; H01L 23/4093; H01L 23/345; H05K 7/20427; H05K 7/20136

See application file for complete search history.

(56) References Cited

U.S. PATENT DOCUMENTS 9,000,584 B2    4/2015    Lin et al.
9,048,222 B2    6/2015    Hung et al.
(Continued)

*Primary Examiner* — Victoria K. Hall
(74) *Attorney, Agent, or Firm* — JCIPRNET

(57) ABSTRACT

A semiconductor device includes a chip package comprising a semiconductor die laterally encapsulated by an insulating encapsulant, the semiconductor die having an active surface, a back surface opposite to the active surface, and a thermal enhancement pattern on the back surface; and a heat dissipation structure connected to the chip package, the heat dissipation structure comprising a heat spreader having a flow channel for a cooling liquid, and the cooling liquid in the flow channel being in contact with the thermal enhancement pattern.

20 Claims, 20 Drawing Sheets

Related U.S. Application Data

(60) Provisional application No. 62/737,859, filed on Sep. 27, 2018.

(51) Int. Cl.
  *H01L 23/40* (2006.01)
  *H01L 21/56* (2006.01)
  *H01L 21/48* (2006.01)
  *H01L 23/00* (2006.01)
  *H01L 21/683* (2006.01)

(52) U.S. Cl.
  CPC ...... *H01L 24/20* (2013.01); *H01L 2023/4018* (2013.01); *H01L 2023/4068* (2013.01); *H01L 2023/4087* (2013.01); *H01L 2221/68359* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 11,177,192 B2 * | 11/2021 | Teng .................. H01L 21/6835 |
| 11,282,791 B2 * | 3/2022 | Teng .................. H01L 21/4857 |
| 2007/0200228 A1 * | 8/2007 | Pu ....................... H01L 23/473 257/E23.098 |
| 2018/0166359 A1 * | 6/2018 | Fukuoka ............. H01L 23/473 |

* cited by examiner

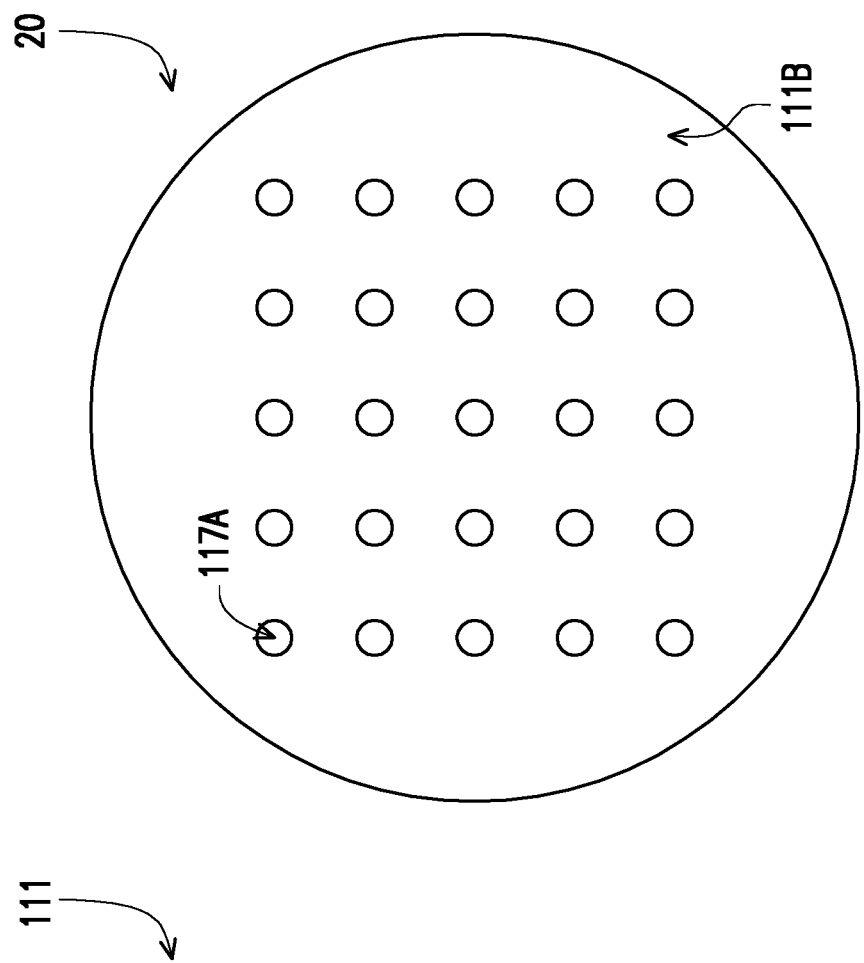
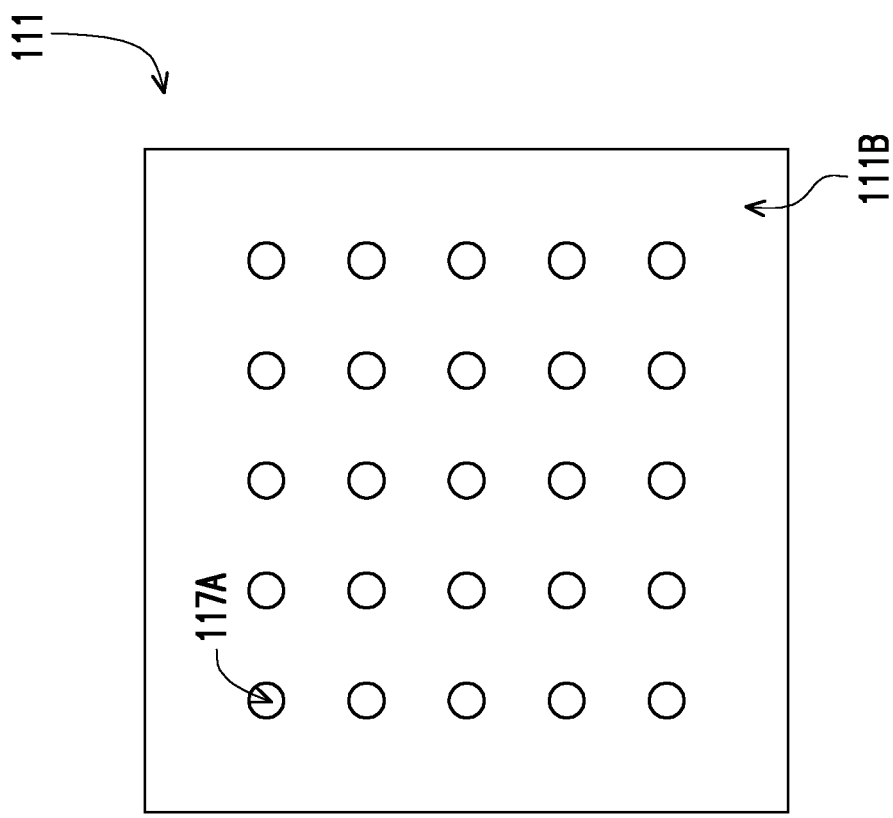

SEMICONDUCTOR DEVICE INCLUDING HEAT DISSIPATION STRUCTURE AND FABRICATING METHOD OF THE SAME

CROSS-REFERENCE TO RELATED APPLICATION

This application is a continuation application of and claims the priority benefit of U.S. application Ser. No. 16/533,789, filed on Aug. 7, 2019, now U.S. Pat. No. 11,177,192, issued Nov. 16, 2021. The prior application Ser. No. 16/533,789 claims the priority benefit of U.S. provisional application Ser. No. 62/737,859, filed on Sep. 27, 2018. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated packages, such as Fan-Out Wafer Level Package (FOWLP), Chip on Wafer on Substrate (CoWoS) package and so on, are becoming increasingly popular for their compactness. As the integration density increased, the power of the semiconductor components increases (i.e. over 16 kw/rack) to handle complicated operation. The more power inputs, the more heat is generated by the semiconductor components.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A and 5B illustrate the back surface of the singulated semiconductor die and the back surface of the wafer respectively in accordance with some embodiments of the present disclosure.

DETAILED DESCRIPTION

Figure 1:
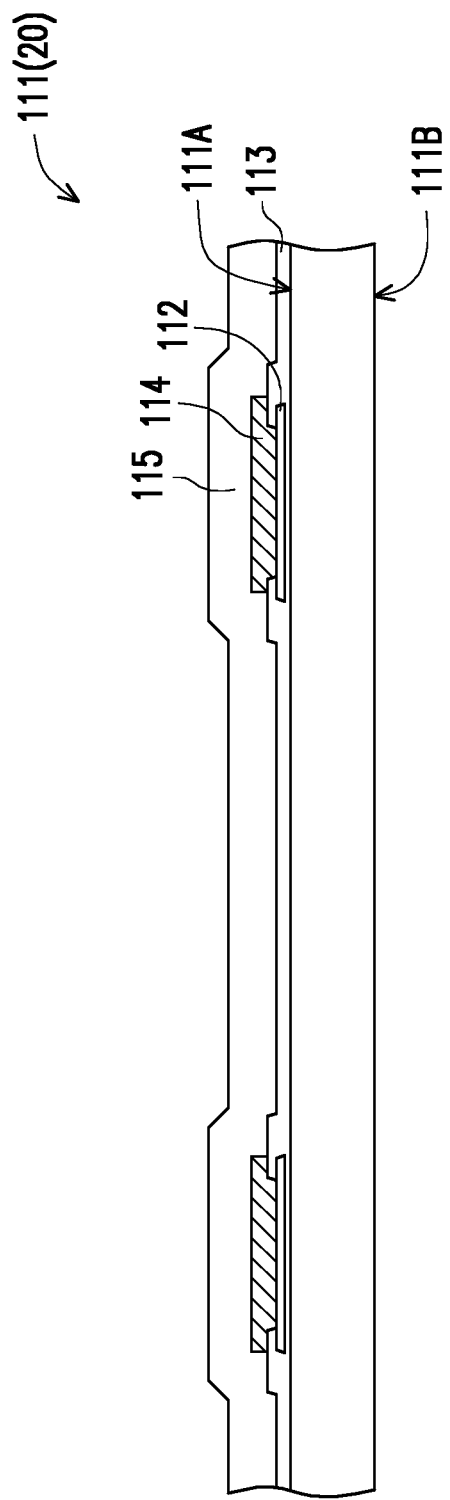
FIG. 1 through FIG. 4 and FIG. 6 through FIG. 10 illustrate a process flow for fabricating a semiconductor device in accordance with some embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 through FIG. 4 and FIG. 6 through 10 illustrate a process flow for fabricating a semiconductor device in accordance with some embodiments of the present disclosure. FIGS. 11A and 11B are top views of a semiconductor device according to the FIG. 10 in accordance with some embodiments of the present disclosure. It is to be noted that the process steps described herein cover a portion of the fabricating processes used to fabricate a package structure. The embodiments are intended to provide further explanations but are not used to limit the scope of the present disclosure. In FIG. 1 through FIG. 4 and FIG. 6 through FIG. 10, semiconductor die is shown to represent plural semiconductor dies 111 of the wafer 20, and a combination of a chip package and a heat dissipation structure is shown to represent a semiconductor device obtained following the fabricating method, for example. In other embodiments, two or more dies are shown to represent plural chips or dies of the wafer, and one or more package structures are shown to represent plural semiconductor devices obtained following the fabricating method, yet the disclosure is not limited thereto.

Referring to FIG. 1, FIG. 1 illustrates the formation of an initial structure of semiconductor die, which may be a part of wafer 20 that includes a plurality of semiconductor dies 111 therein. The semiconductor dies 111 may include active components (e.g., transistors or the like) and passive components (e.g., resistors, capacitors, inductors or the like) formed therein. In accordance with some embodiments of the present disclosure, the semiconductor dies 111 includes a crystalline silicon substrate. In accordance with other embodiments of the present disclosure, the semiconductor dies 111 includes an elementary semiconductor substrate such as germanium; a compound semiconductor substrate including silicon carbon, gallium arsenic, gallium phosphide, indium phosphide, indium arsenide, and/or indium antimonide; an alloy semiconductor substrate including SiGe, GaAsP, AlInAs, AlGaAs, GaInAs, GaInP, and/or GaInAsP; or combinations thereof. Other semiconductor substrates such as multi-layered or gradient substrates may also be used. The semiconductor dies 111 includes an active surface 111A and a back surface 111B opposite to the active surface 111A, as illustrated in FIG. 1, the active surface 111A of the semiconductor dies 111 is referred to as the top surface of semiconductor dies 111, and a back surface 111B is referred to as the bottom surface of semiconductor dies 111, for example.

In some embodiments, the semiconductor dies 111 or the wafer 20 may include connection pads 112 and a passivation layer 113. The connection pads 112 are formed on the active surface 111A of the semiconductor dies 111 or the wafer 20 to physically and electrically connect the active device, passive device or integrated circuit in the semiconductor dies 111 and include a conductive material such as aluminum (Al), copper (Cu), or other suitable metal. The passivation layer 113 such as an oxide film, a nitride film, a dielectric film (such as benzocyclobutene (BCB), polybenzoxazole (PBO)), or the like, is formed on the active surface 111A of the semiconductor dies 111 and exposes at least portions of the connection pads 112.

In some embodiments, the semiconductor dies 111 or the wafer 20 include a plurality of conductive pillars 114 formed over each of the exposed portions of the connection pads 112. In some embodiments, the conductive pillars 114 are plated on and electrically connected to the connection pads 112. The plating process of conductive pillars 114 is described in detail as followings. First, a seed layer (not shown) is sputtered onto the passivation layer 113 and the exposed portions of the connection pads 112, for example. A patterned photoresist layer (not shown) such as patterned mask layer 116 may be then formed over the seed layer by photolithography, wherein the patterned photoresist layer exposes portions of the seed layer that are corresponding to the exposed portions of the connection pads 112. The wafer 20 including the patterned photoresist layer formed thereon is then immersed into a plating solution of a plating bath such that the conductive pillars 114 are plated on the exposed portions of the seed layer. After the plated conductive pillars 114 are formed, the patterned photoresist layer is stripped by an acceptable ashing or stripping process. Thereafter, by using the conductive pillars 114 as a hard mask, portions of the seed layer that are not covered by the conductive pillars 114 are removed through etching until the passivation layer 113 is exposed, for example.

In some embodiments, after the conductive pillars 114 are formed, a protection layer 115 is formed on the passivation layer 113 so as to cover the conductive pillars 114. In some embodiments, the protection layer 115 may be a polymer layer having sufficient thickness to encapsulate and protect the conductive pillars 114. For example, the protection layer 115 may be a polybenzoxazole (PBO) layer, a polyimide (PI) layer or other suitable polymers. In some alternative embodiments, the protection layer 115 may be made of inorganic materials.

Figure 2:
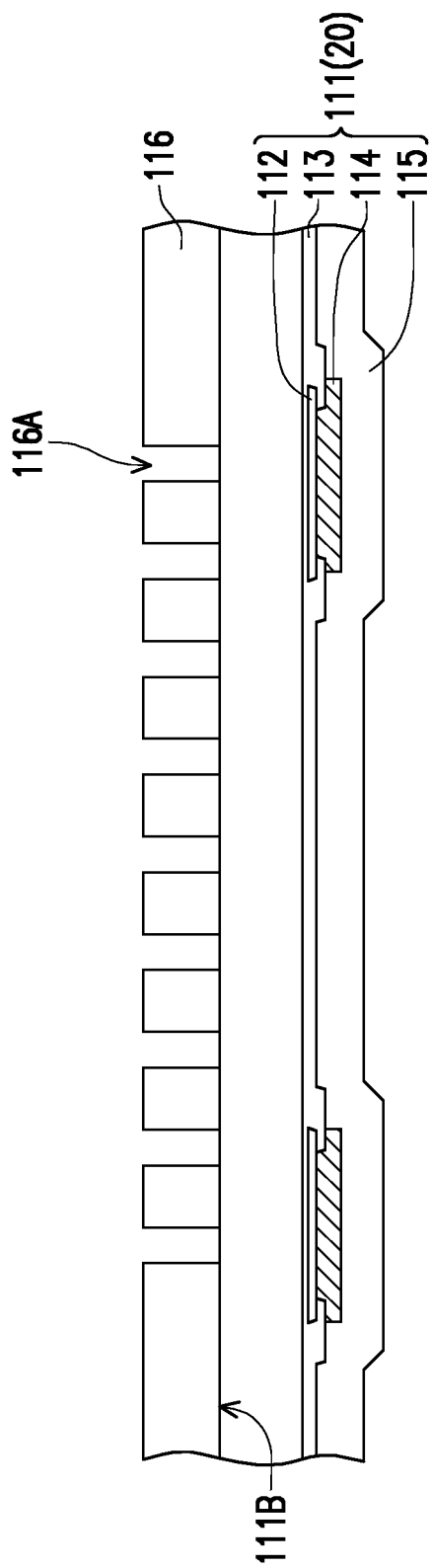

Referring to FIG. 2, the wafer 20 is flipped upside down. A patterned mask layer 116 formed on the back surface 111B of semiconductor dies 111 or the wafer 20 may include a plurality of openings 116A which expose portions of the back surface 111B. In some embodiments, the patterned mask layer 116 may be formed of silicon nitride, titanium nitride, or the like. In some embodiments, the patterned mask layer 116 is formed of silicon nitride, for example, by Low-Pressure Chemical Vapor Deposition (LPCVD). In accordance with other embodiments, the patterned mask layer 116 is formed by thermal nitridation of silicon, Plasma Enhanced Chemical Vapor Deposition (PECVD), or the like. The patterning process of patterned mask layer 116 is described in detail as follows. A photoresist layer is formed on the back surface 111B of the semiconductor dies 111. A patterned mask layer (not shown) with plurality of openings corresponding to the plurality of openings 116A may be located above the photoresist layer. Once the patterned mask layer is formed, an etching process is performed to form the patterned mask layer 116 using the patterned mask as an etching mask.

Figure 3:
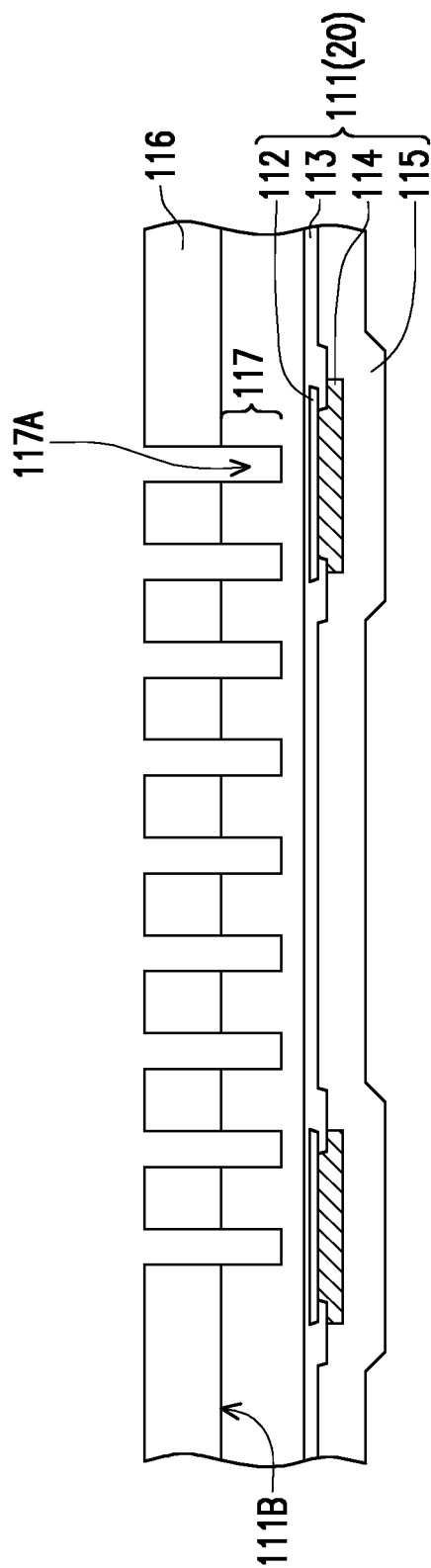

Next, in some embodiments, once the patterned mask layer 116 is formed on the back surface 111B of semiconductor dies 111 or the wafer 20, an etching process is performed to form a thermal enhancement pattern 117 shown in FIG. 3. The etching process may include a wet etching process, which may be performed using KOH, Tetra Methyl Ammonium Hydroxide (TMAH), or the like as an etchant. After the etching process is performed to form the thermal enhancement pattern 117 on the back surface 111B of the semiconductor dies 111, the patterned mask layer 116 is removed from the back surface 111B of the semiconductor dies 111. In some embodiments, the thermal enhancement pattern 117 includes recesses 117A extends from the back surface 111B of the semiconductor dies 111 into the semiconductor dies 111. As illustrated in FIG. 3, the depth of the recesses 117A is less than the thickness of the semiconductor dies 111 or the wafer 20. For example, the depth of the recesses 117 is about 10% to about 50% of the thickness of the semiconductor dies 111 or the wafer 20. The area occupied by the recesses 117A may range from about 10% to about 80% of the area of the back surface 111B of the semiconductor dies 111. The recesses 117A may be formed on the back surface 111B of the semiconductor dies 111 or the wafer 20 without significantly decreasing structural strength of the semiconductor dies 111 or the wafer 20.

Figure 4:
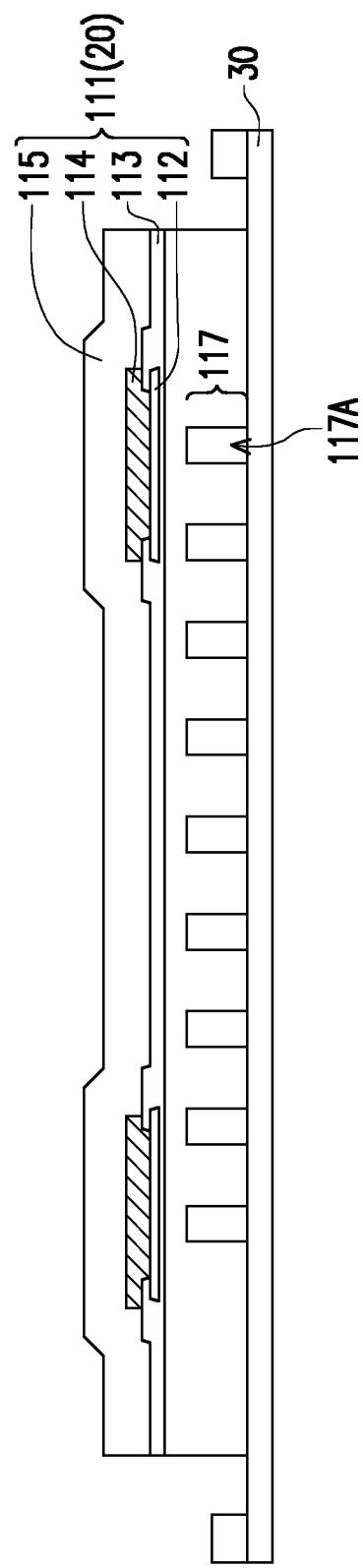

Referring to FIG. 4, after striping the patterned mask layer 116 from the back surface 111B of the semiconductor dies 111, the wafer 20 is flipped upside down and mounted onto a tape 30 such that the back surface 111B of the semiconductor dies 111 or the wafer 20 are adhered with the tape 30. In some embodiments, the tape 30 may support the wafer 20 mounted thereon and temporarily adhere with the back surface 111B of the wafer 20. After mounting the wafer 20 on the tape 30, a wafer dicing process is performed on the wafer 20 such that the wafer 20 is singulated. After performing the singulation process, a plurality of singulated semiconductor dies 111 temporarily adhered with the tape 30 are formed. As shown in FIG. 4, each of the singulated semiconductor dies 111 includes the connection pads 112, a passivation layer 113, the conductive pillars 114, and the protection layer 115.

Moreover, during the wafer dicing process, the protection layer 115 may well protect the conductive pillars 114 of the singulated semiconductor dies 111. In addition, the conductive pillars 114 of the singulated semiconductor dies 111 may be protected from being damaged by subsequently performed processes, such as the picking-up and placing process of the singulated semiconductor dies 111, the molding process, and so on.

In some alternative embodiments, the wafer 20 temporarily adhered with the tape 30 may not be singulated into the plurality of singulated semiconductor dies 111 and the wafer 20 may be packed by the subsequently performed processes as illustrated in FIG. 6 through FIG. 10.

FIG. 5A and FIG. 5B illustrate the back surface 111B of the singulated semiconductor die 111 and the back surface 111B of the wafer 20, respectively. As illustrated in FIG. 5A, in some embodiments which the wafer is singulated into the singulated semiconductor dies 111, the back surface 111B of each singulated semiconductor die 111 may be singulated into the desired shape such as rectangular shape for the subsequent packaging processes. However, as illustrated in FIG. 5B, in some alternative embodiments, the wafer 20 may not be singulated and have round shape.

Figure 6:
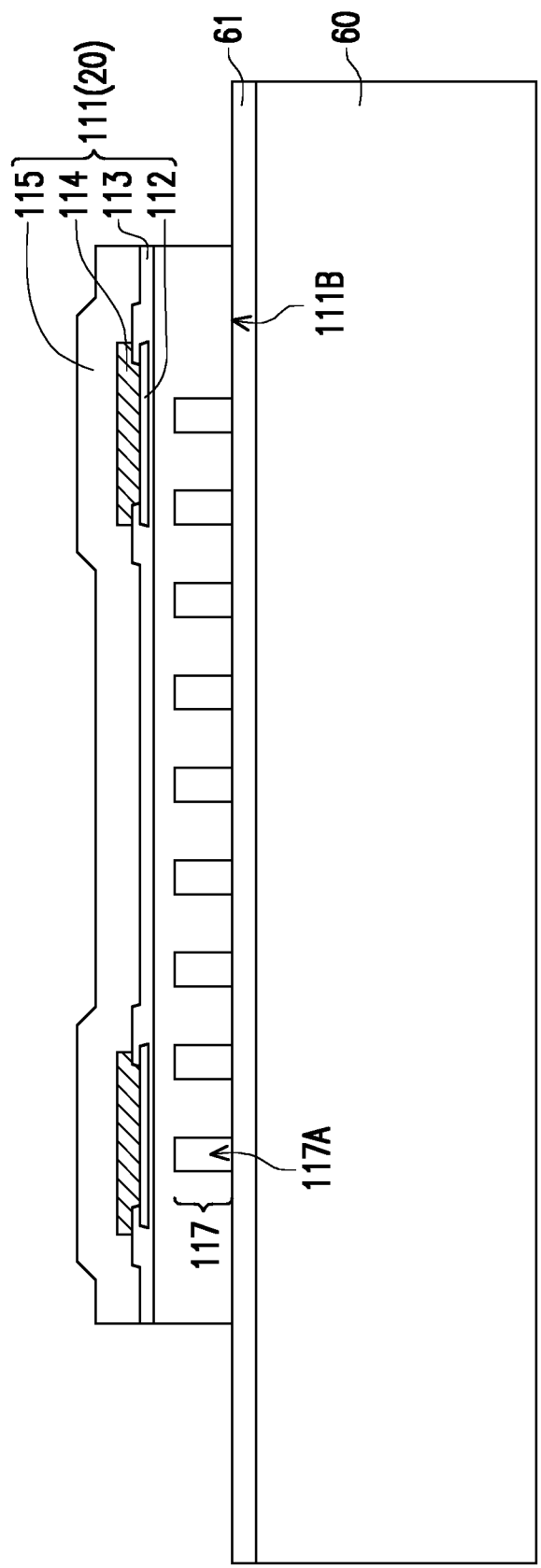

Referring to FIG. 6, a carrier 60 having a de-bonding layer 61 formed thereon is provided. In some embodiments, the carrier 60 is a glass substrate and the de-bonding layer 61 is formed on the glass substrate. In some embodiments, the de-bonding layer 61 may include a dielectric material layer made of an epoxy-based thermal-release material, which loses its adhesive property when being heated, such as a light-to-heat-conversion (LTHC) release coating film. In alternative embodiments, the de-bonding layer 61 may include a dielectric material layer made of an ultra-violet (UV) glue, which loses its adhesive property when being exposed to UV lights, for example. however, the disclosure is not limited thereto.

In some embodiments, the wafer 20 or at least one of the singulated semiconductor dies 111 singulated from the wafer 20 is picked-up from the tape 30 and placed on the de-bonding layer 61 carried by the carrier 60. For example, the wafer 20 or the singulated semiconductor die 111 is disposed on the de-bonding layer 61 carried by the carrier 60 such that the back surface 111B of the singulated semiconductor die 111 or the wafer 20 is in contact with the de-bonding layer 61 and the thermal enhancement pattern 117 (e.g., the recesses 117A) is enclosed by the de-bonding layer 61.

Figure 7:
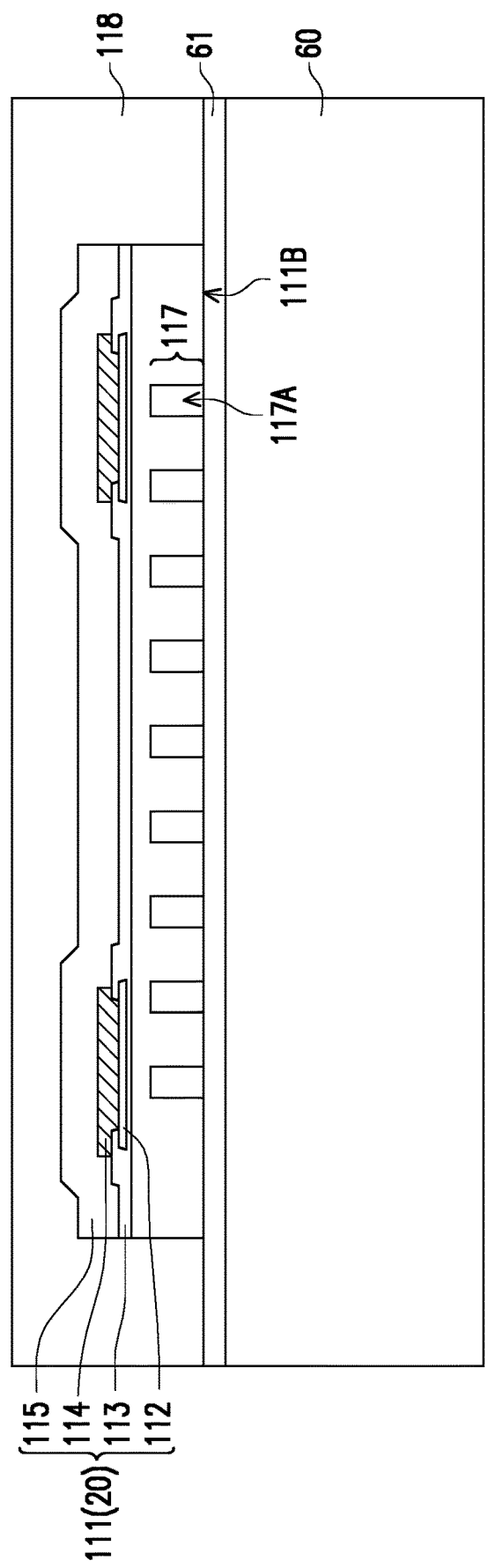

Referring to FIG. 7, an insulating material 118 is formed on the de-bonding layer 61 to cover the at least one of the singulated semiconductor dies 111 or the wafer 20. In some embodiments, the insulating material 118 is a molding compound formed by an over-mold process. The conductive pillars 114 and the protection layer 115 of the singulated semiconductor die 111 or the wafer 20 are covered by the insulating material 118. As illustrated in FIG. 7, the conductive pillars 114 and the protection layer 115 of singulated the semiconductor die 111 are not revealed and are well protected by the insulating material 118. In some embodiments, the insulating material 118 includes epoxy resin or other suitable dielectric materials.

Figure 8:
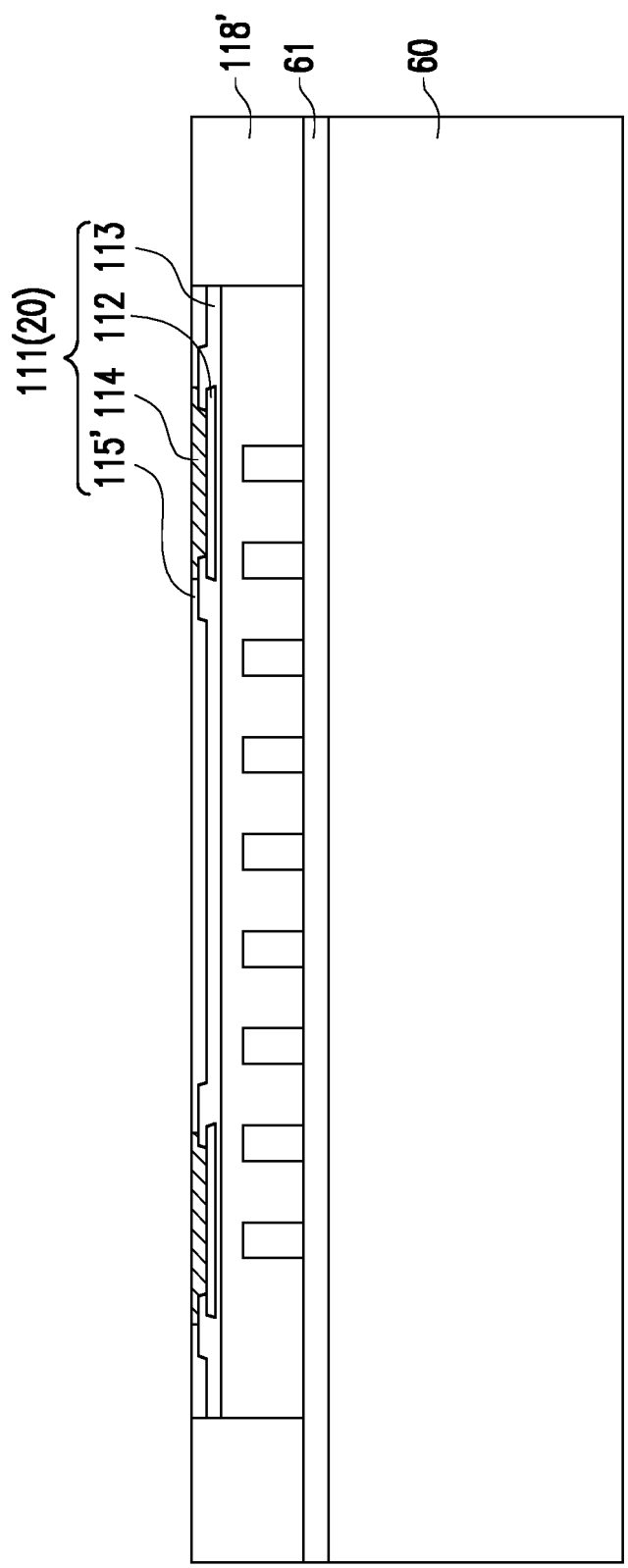

Referring to FIG. 8, the insulating material 118 is then ground until the top surfaces of the conductive pillars 114 and the top surface of the protection layer 115 are exposed. In some embodiments, the insulating material 118 is ground by a mechanical grinding process, a chemical mechanical polishing (CMP) process or combinations thereof. After the insulating material 118 is ground, an insulating encapsulant 118' is formed over the de-bonding layer 61 to laterally encapsulate the singulated semiconductor die 111 or the wafer 20. In other words, the insulating encapsulant 118' is in contact with and surrounds sidewalls of the singulated semiconductor die 111 or the wafer 20. During the grinding process of the insulating material 118, portions of the protection layer 115 are ground to reveal the conductive pillars 114 and a protection layer 115' is formed to laterally encapsulate the conductive pillars 114. In some embodiments, after the forming of the insulating encapsulant 118' and the protection layer 115', the top surface of the insulating encapsulant 118', the top surfaces of the conductive pillars 114 and the top surface of the protection layer 115' are substantially at the same level.

Figure 9:
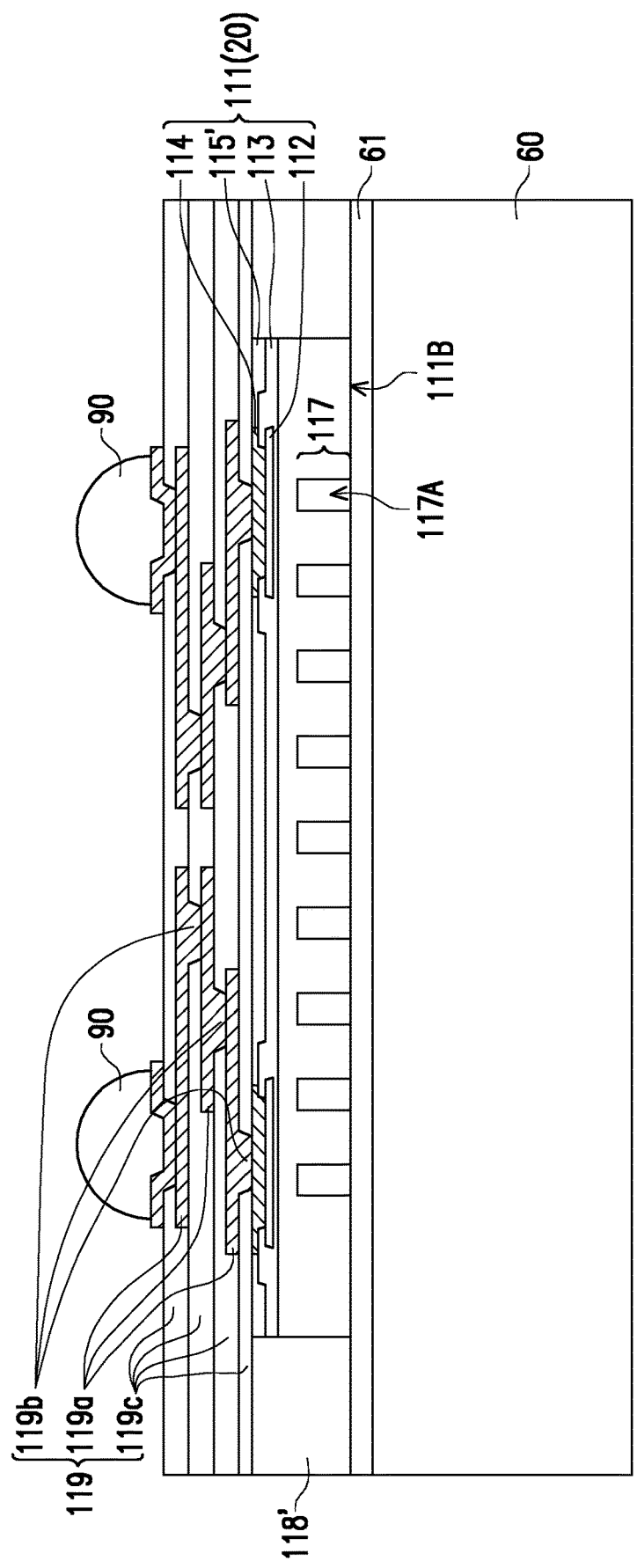

Referring to FIG. 9, after the insulating encapsulant 118' and the protection layer 115' are formed, a redistribution circuit structure 119 electrically connected to the conductive pillars 114 of the singulated semiconductor die 111 or the wafer 20 is formed on the top surfaces of the top surface of the insulating encapsulant 118', the top surfaces of the conductive pillars 114, and the top surface of the protection layer 115'. The redistribution circuit structure 119 may include a plurality of redistribution wirings 119a, a plurality of vias 119b, and a plurality of patterned dielectric layers 119c, as shown in FIG. 9. The redistribution wirings 119a and the patterned dielectric layers 119c are stacked alternately, and the vias 119b are embedded in and penetrate the patterned dielectric layers 119c to electrically connect the redistribution wirings 119a. For example, the redistribution wirings 119a and a plurality of vias 119b may be copper wirings and copper vias, and the material of the patterned dielectric layers 119c may include polyimide (PI), polybenzoxazole (PBO) or other suitable dielectric polymer. In some embodiments, the material of the patterned dielectric layers 119c may be the same material as the protection layer 115'.

Figure 10:
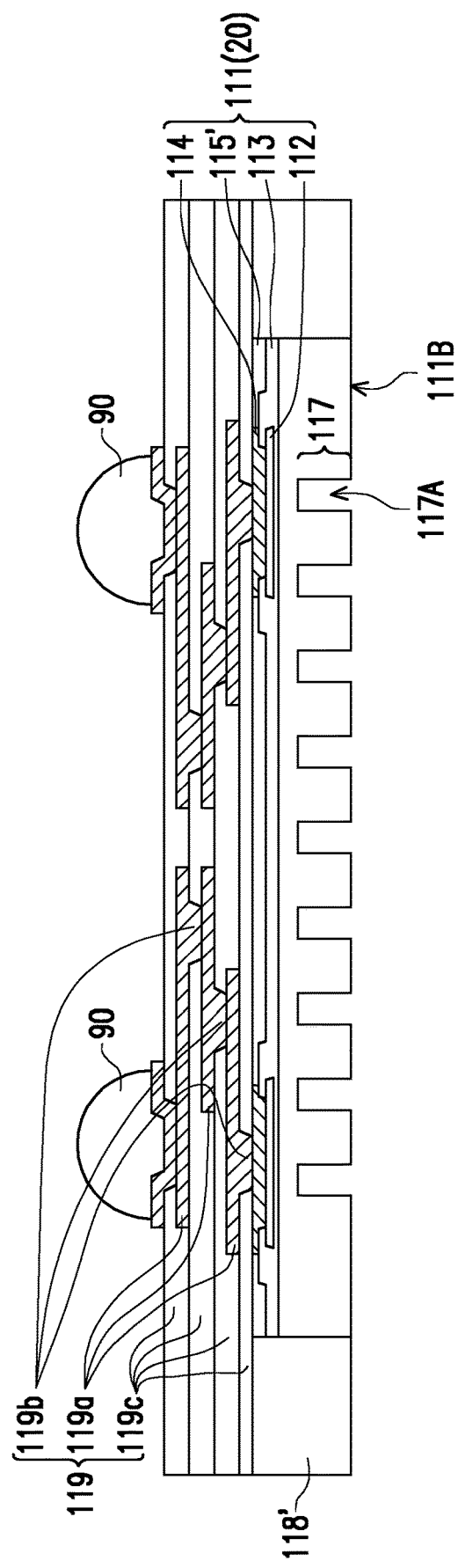

Referring to FIG. 9 and FIG. 10, after forming the redistribution circuit structure 119, a plurality of conductive features 90 electrically connected to the redistribution circuit structure 119 are formed. The conductive features 90 are disposed on the redistribution circuit structure 119 and are arranged in array. Thus, the chip package 110 including the semiconductor chip 111, the insulating encapsulant 118', redistribution circuit structure 119, and the conductive features 90 are formed. In some embodiments, the conductive features 90 may be conductive balls (e.g., solder balls) arranged in array. Subsequently, the de-bonding layer 61 and the carrier 60 is de-bonded from the chip package 110 such that the back surface 111B of the semiconductor die 111 or the wafer 20, the bottom surface of the insulating encapsulant 118' opposite to the top surface of the insulating encapsulant 118' are de-bonded from the carrier 60 and are thus revealed. After de-bonding, the back surface 111B of the semiconductor die 111 and the thermal enhancement pattern 117 (e.g., the recesses 117A) formed thereon are revealed. The bottom surface of the insulating encapsulant 118' and the back surface 111B of the semiconductor die 111 or the wafer 20 are substantially at the same level after de-bonding. In some embodiments, the external energy such as UV laser, visible light or heat, may be applied to the de-bonding layer 61 such that the chip package 110 and the de-bonding layer 61 carried by the carrier 60 can be separated from each other.

Figure 11:
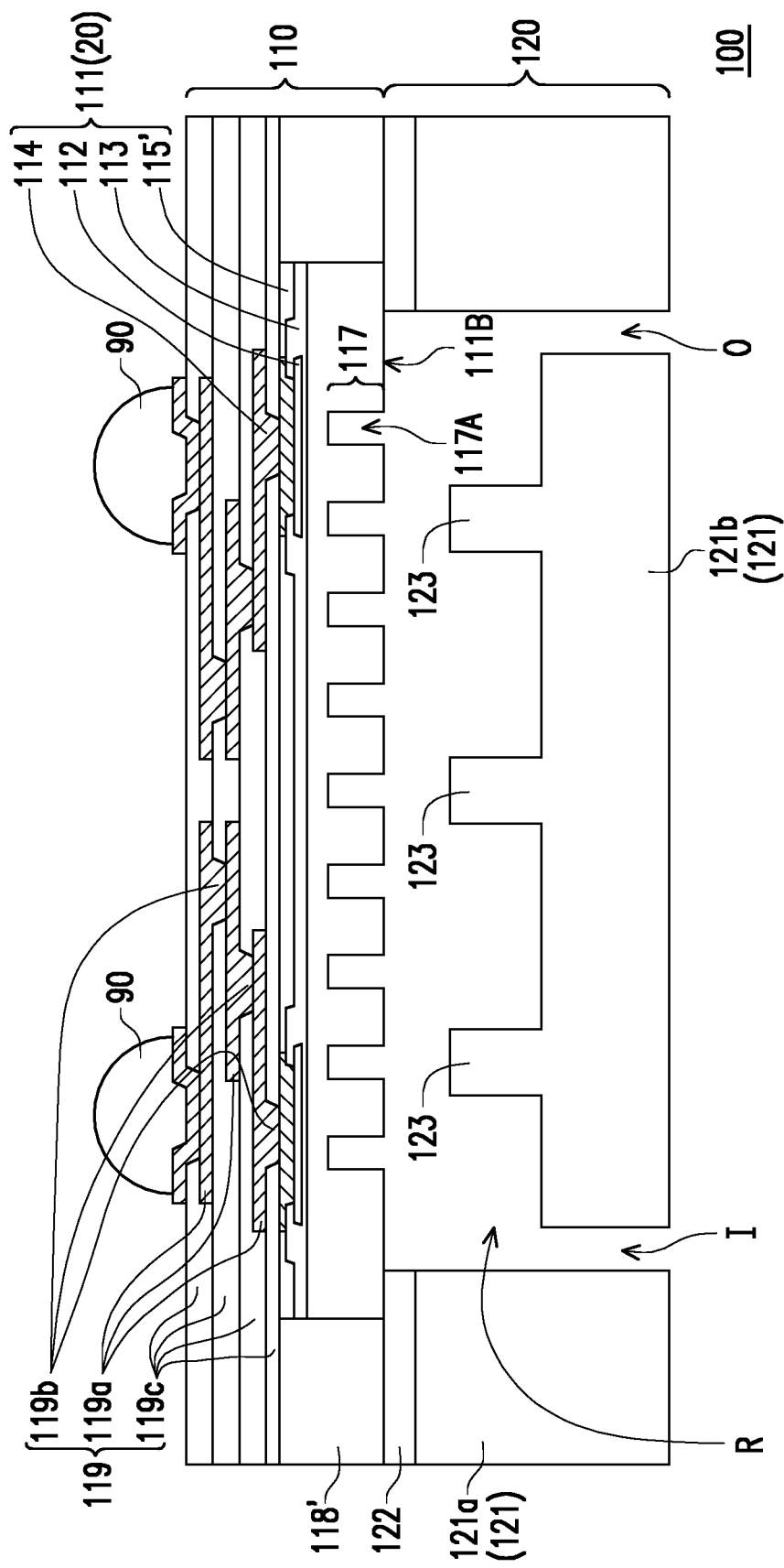
FIG. 11 through 19 illustrate alternative embodiments in accordance with some embodiments of the present disclosure.

Referring to FIG. 11, the chip package 110 is disposed over and assembled with a first heat dissipation structure 120 which includes a heat spreader 121 and a first sealing member 122. The chip package 110 is assembled with side wall 121a of the heat spreader 121 through the first sealing member 122. As illustrated in FIG. 11, the first sealing member 122 is disposed between the chip package 110 and the side wall 121a of the heat spreader 121. Both the chip package 110 and the side wall 121a of the heat spreader 121 are in contact with the first sealing member 122. In some embodiments, an inner side surface of the first sealing member 122 and an inner side surface of the side wall 121a of the heat spreader 121 are substantially aligned with each other in vertical direction. Furthermore, in some embodiments, a side surface of the semiconductor die 111 or the wafer 20 is not aligned with the inner side surfaces of the side wall 121a and the first sealing member 122 such that the interface between the insulating encapsulant 118' and the semiconductor die 111 (or the wafer 20) may be protected by the first sealing member 122 from delamination. The first sealing member 122 not only provides sealing function but also serves as stress buffer between the chip package 110 and the side wall 121a of the heat spreader 121. The first sealing member 122 may prevent the chip package 110 from directly contacting the side wall 121a of the heat spreader 121 to increase assembly yield rates of the first heat dissipation structure 120. The heat spreader 121 has a recess R surrounded by the side wall 121a and bottom plate 121b of the heat spreader 121. In some embodiments, the recess R is corresponding to the thermal enhancement pattern 117 (e.g., the recesses 117A) on the back surface 111B of the semiconductor die 111 or the wafer 20. The first sealing member 122 disposed on the back surface 111B of the semiconductor die 111 or the wafer 20 and the bottom surface of the insulating encapsulant 118' may expose the thermal enhancement pattern 117. Therefore, after assembling the chip package 110, the first sealing member 122 and the heat spreader 121, the recess R is capped or enclosed by the back surface 111B of the semiconductor die 111 or the wafer 20 and the recess R may serve as flow channel for cooling liquid (e.g., cooling water or other types of coolant). After assembling the chip package 110, the first sealing member 122 and the heat spreader 121, the recess R and the recesses 117A are communicated with each other, and both the recess R and the recesses 117A may serve as flow channel for cooling liquid. In some embodiments, the heat spreader 121 further includes an inlet I and an outlet O communicated with the flow channel, wherein the inlet I and the outlet O penetrate through the bottom plate 121b of the heat spreader 121. The cooling liquid may be applied and flow into the flow channel (e.g., the recess R and the recesses 117A) from the inlet I and may flow out from the outlet O. The material of the first sealing member 122 may include organic adhesive such as polybutylacrylate (PBA) or other suitable sealants. In some embodiments, the first sealing member 122 may not only cover the bottom surface of the insulating encapsulant 118', but also partially cover the back surface 111B of the semiconductor die 111 or the wafer 20. However, the distribution of the first sealing member 122 is not limited in the present disclosure. The material of the heat spreader 121 may be high thermal conductivity material such as copper, aluminum, steel, the combination thereof and so on. In some embodiments, the inlet I and the outlet O formed on the heat spreader 121 may be machined using a laser drill, a mechanical drill or the like.

Moreover, in some embodiments, the heat spreader 121 includes thermal enhancement protrusions 123 formed on an inner top surface of the bottom plate 121b. The thermal enhancement protrusions 123 protrude from the inner top surface of the bottom plate 121b toward the back surface 111B of the semiconductor die 111 or the wafer 20. Furthermore, the thermal enhancement protrusions 123 extend into the recess R between the bottom plate 121b and the semiconductor die 111 or the wafer 20. In certain embodiments, the thermal enhancement protrusions 123 and the thermal enhancement pattern 117 face to each other. In some embodiments, as illustrated in FIG. 11, the thermal enhancement protrusions 123 are not in contact with the back surface 111B of the semiconductor die 111 such that a gap is formed between the thermal enhancement protrusions 123 and the back surface 111B of the semiconductor die 111 or the wafer 20. In certain embodiments, the thermal enhancement protrusions 123 may generate turbulence of the cooling liquid when the cooling liquid flows in the recess R so as to further enhance the ability of heat dissipation of the heat spreader 121. Meanwhile, the thermal enhancement pattern 117 (e.g., the recesses 117A) formed on the back surface 111B of the semiconductor dies 111 or the wafer 20 may serve as heat dissipation fins to increase the contact area of the semiconductor die 111 and cooling liquid such that the heat dissipation ability of the heat spreader 121 is enhanced. Moreover, the first sealing member 122 serves as a sealant for preventing the cooling liquid from leakage.

FIG. 12 to FIG. 19 are schematic cross-sectional views of alternative embodiments of a semiconductor device according to some exemplary embodiments of the present disclosure.

Figure 12:
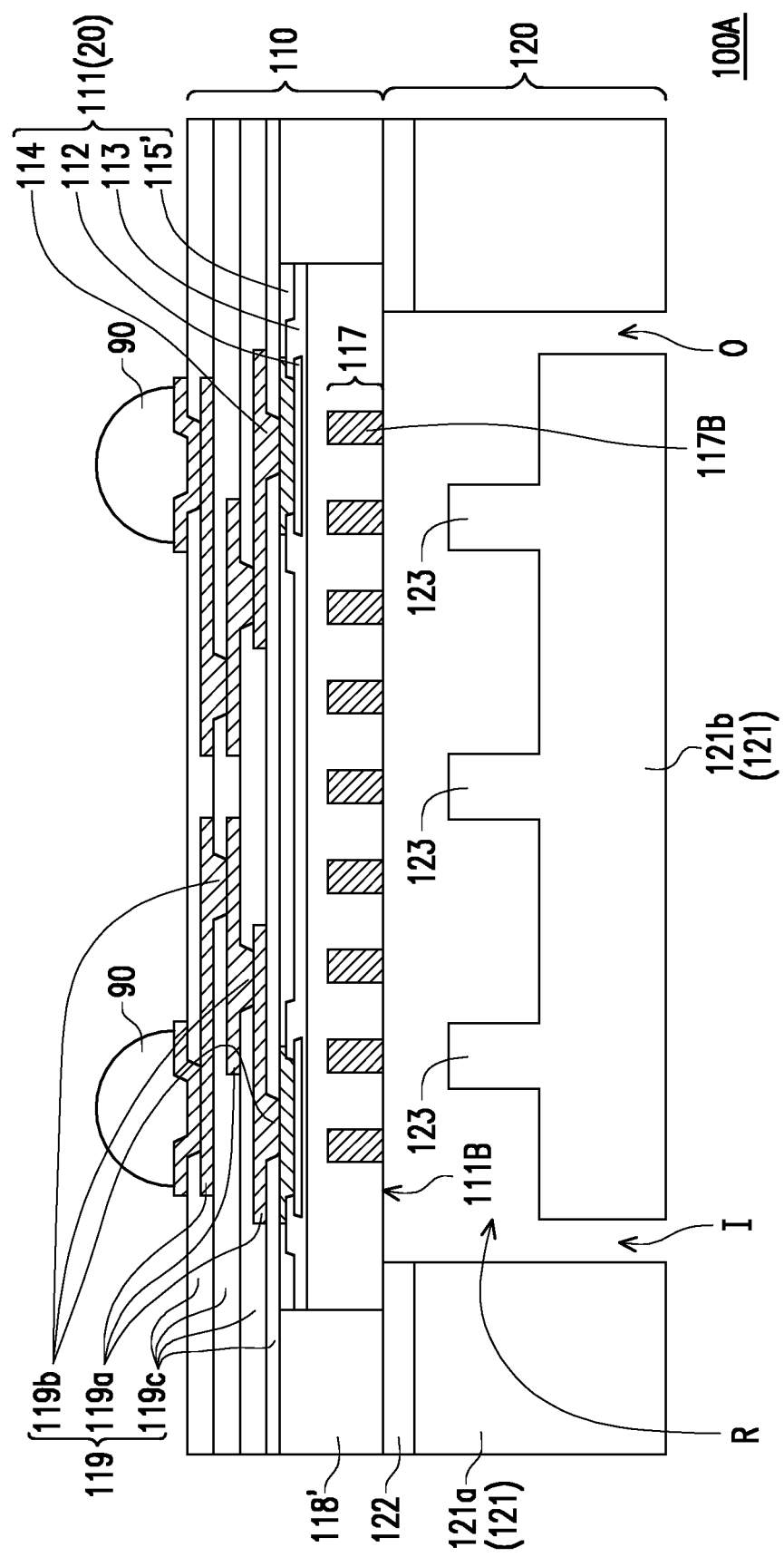

Referring to FIG. 12, in the semiconductor device 100A, the thermal enhancement pattern 117 (e.g., the recesses 117A) may be filled with the conductive material 117B (e.g., thermal conductive posts) to enhance the ability of heat dissipation. In some alternative embodiments, after the patterned mask layer 116 is removed from the back surface 111B of the semiconductor die 111 or the wafer 20 as shown in FIG. 3, the conductive material 117B is embedded in the recesses 117A of the thermal enhancement pattern 117. In some embodiments, the conductive material 117B may be formed by sputtering of a seed layer on the back surface 111B of the semiconductor die 111 or the wafer 20. In some embodiments, the seed layer may be a metal layer with high thermal conductivity, which may be a single layer or a composite layer including a plurality of sub-layers formed of different materials. In some embodiments, the seed layer includes a titanium layer and a copper layer over the titanium layer. The seed layer may be formed using, for example, PVD or the like. Once the seed layer is deposited, the process of developing the photoresist on the back surface 111B of the semiconductor die 111 or the wafer 20 may be performed. Then, conductive materials are plated on the portions of the seed layer which are not covered by the patterned photoresist to fill the recesses 117A. Subsequently, patterned photoresist may be stripped and the seed layer and the conductive materials may be ground or polished by a CMP process until the portion of the back surface 111B of the semiconductor die 111 or the wafer 20 is exposed. However, the forming of the conductive material 117B is not limited in the present disclosure. In certain embodiments, the conductive material 117B may be copper or other suitable material with high thermal conductivity. Because of the high thermal conductivity, the conductive material 117B may further enhance the ability of heat dissipation. In certain embodiments, the exposed surface of the conductive material 117B and the back surface 111B of the semiconductor die 111 or the wafer 20 are substantially at the same level, and the gap may be formed between the thermal enhancement protrusions 123 and the back surface 111B of the semiconductor die 111 or the wafer 20.

Figure 13:
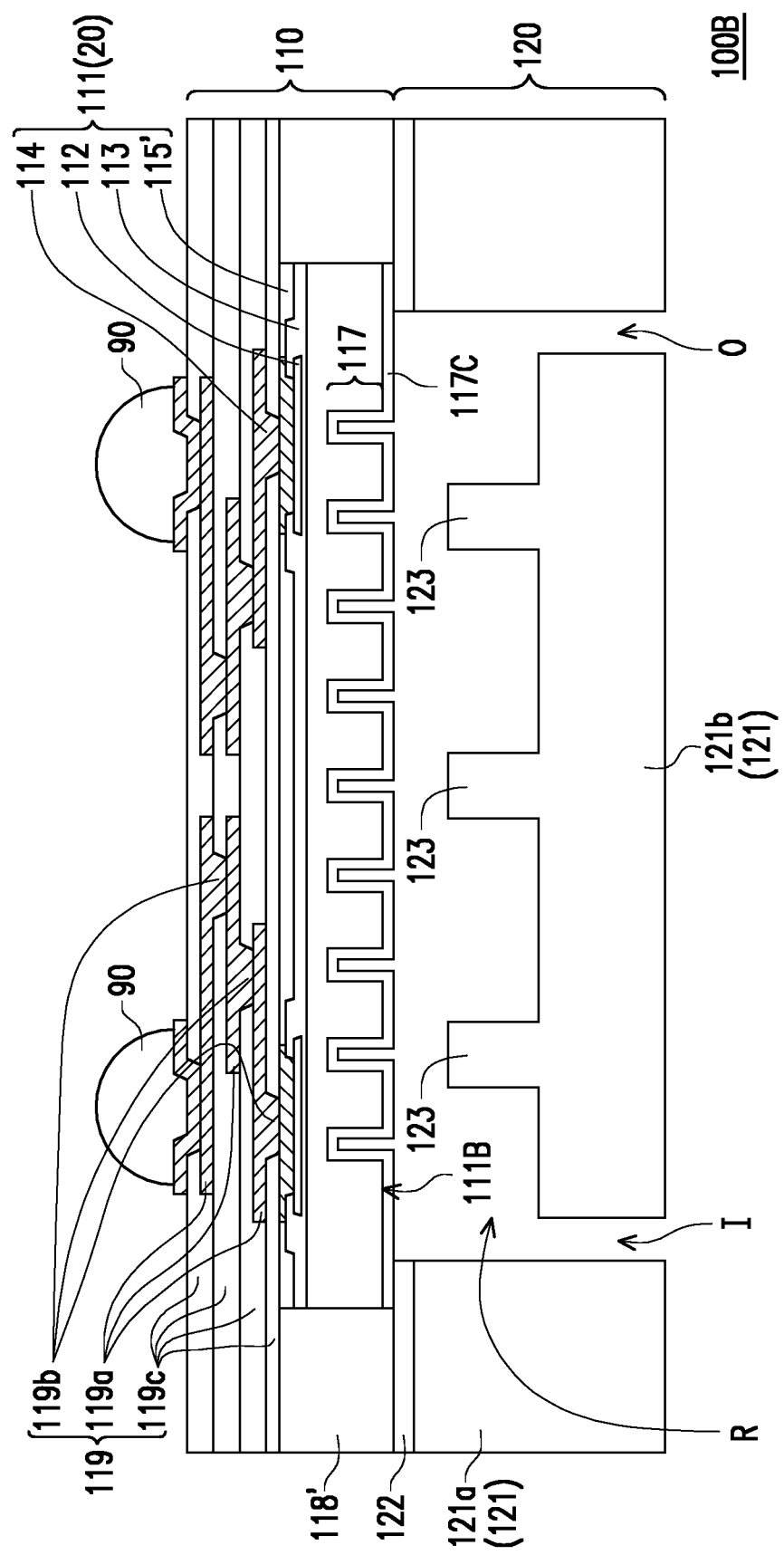

Referring to FIG. 13, in some alternative embodiments, after the patterned mask layer 116 is removed from the back surface 111B of the semiconductor die 111 or the wafer 20 as shown in FIG. 3, the conductive material 117C may be blanket deposited over the back surface 111B of the semiconductor die 111 or the wafer 20. The conductive material 117C may include one or more layers of copper, gold, a combination thereof, or other suitable material with high thermal conductivity, and may be formed by ALD, PVD, CVD, a combination thereof, or the like. In certain embodiments, the conductive material 117C may be formed conformally and includes a first conductive portion located inside the thermal enhancement pattern 117 (e.g., the recesses 117A) and a second conductive portion located outside the thermal enhancement pattern 117. In other words, the first portion of the conductive material 117C at least partially fills the recesses 117A and the second portion of the conductive material 117C is formed on the back surface 111B of the semiconductor die 111 or the wafer 20. In some embodiments, the conductive material 117C may partially or fully cover the back surface 111B of the semiconductor die 111 or the wafer 20 except the region of the thermal enhancement pattern 117 (e.g., the recesses 117A). In certain embodiments, the thermal enhancement pattern 117 (e.g., the recesses 117A) may be partially or fully filled with the conductive material 117C1. In certain embodiments, when the semiconductor device 100B operates, the conductive material 117C may serves as the heat dissipation fin structures to increase the contact area of the semiconductor die 111 or the wafer 20 and the cooling liquid in a limited region. In certain embodiments, the gap may be formed between the thermal enhancement protrusions 123 and the conductive material 117C such that the cooling liquid flows in the recess R so as to further enhance the ability of heat dissipation of the heat spreader 121.

Figure 14:
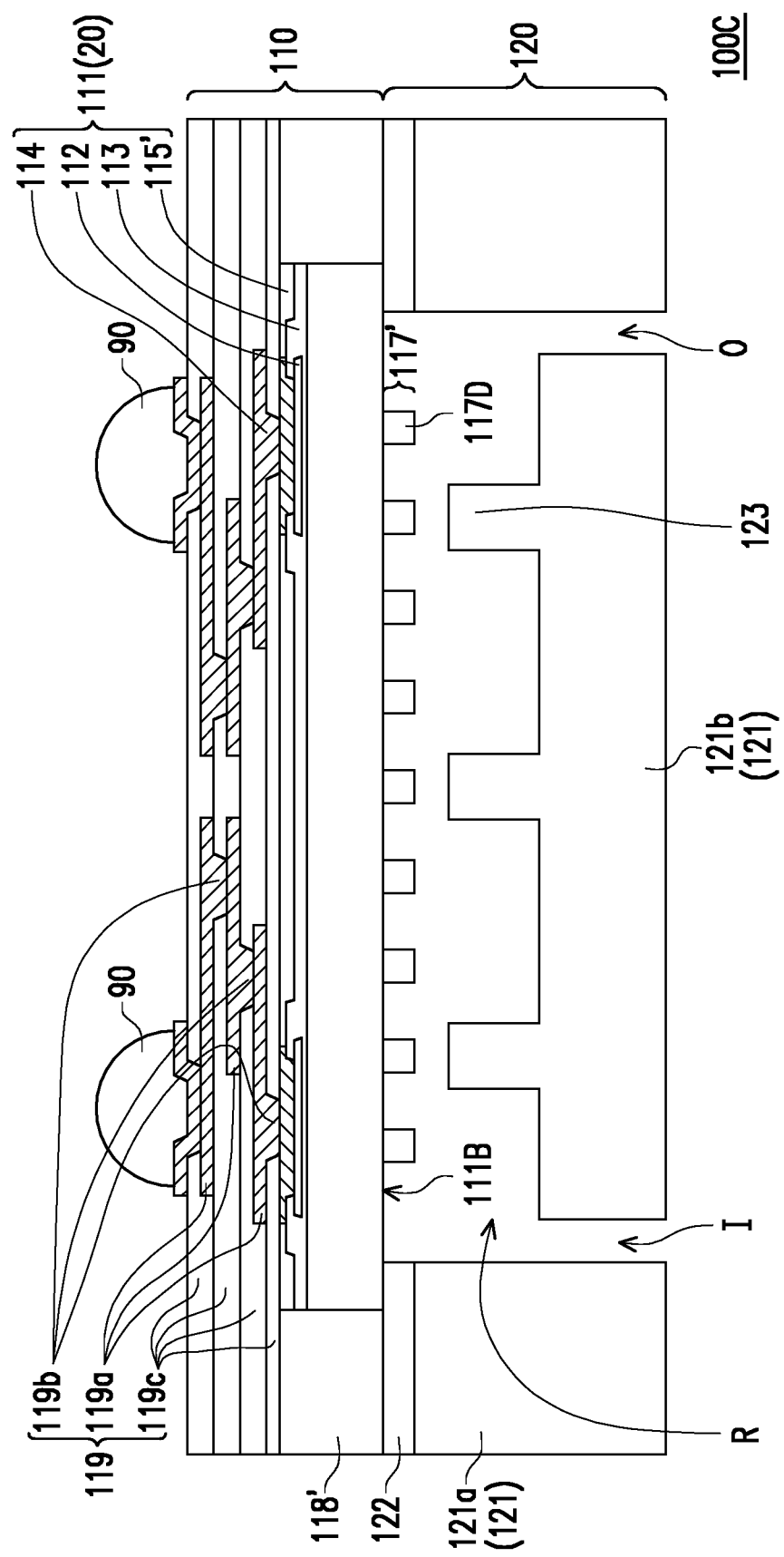

Referring to FIG. 14, in some alternative embodiments, rather than performing the etching process to form the thermal enhancement pattern 117 (e.g., the recesses 117A) as shown in FIG. 3, the thermal enhancement pattern 117' may be formed over the back surface 111B of the semiconductor die 111 or the wafer 20. In the semiconductor device 100C, the thermal enhancement pattern 117' includes conductive protrusions 117D protruding outwardly from the back surface 111B of the semiconductor die 111 or the wafer 20. The steps for forming the thermal enhancement pattern 117' are described by following description. A seed layer may be formed over the back surface 111B of the semiconductor die 111 or the wafer 20. In some embodiments, the seed layer may be a metal layer with high thermal conductivity, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist (not shown) is then formed and patterned on the seed layer. The photoresist may be formed by spin coating or the like and may be exposed to the light for patterning. The patterned photoresist corresponds to the desired thermal enhancement pattern 117'. Then, an electroplating process may be performed to form the conductive protrusions 117D on the seed layer exposed by the patterned photoresist. The conductive protrusions 117D may include a metal, like copper, gold, a combination thereof, or other suitable material with high thermal conductivity. Once the conductive protrusions 117D has been formed, the patterned photoresist and the portions of the seed layer on which the conductive protrusions 117D is not formed may be removed.

The patterned photoresist may be removed by an acceptable ashing or stripping process, such as using an oxygen plasma or the like. In some embodiments, once the patterned photoresist has been removed, exposed portions of the seed layer are removed by using an acceptable etching process, such as wet or dry etching. Thus, the remaining portions of the seed layer and conductive material may together form the thermal enhancement pattern 117' (e.g., the conductive protrusions 117D). In some embodiments, the thermal enhancement pattern 117' protruding from the back surface 111B of the semiconductor die 111 or the wafer 20 may serve as the fin structures to increase the contact area of the semiconductor die 111 or the wafer 20 and the cooling liquid in a limited region. In certain embodiments, the gap may be formed between the thermal enhancement protrusions 123 and the thermal enhancement pattern 117' (e.g., the conductive protrusions 117D) such that the cooling liquid flows in the recess R to further enhance the ability of heat dissipation of the heat spreader 121.

Figure 15:
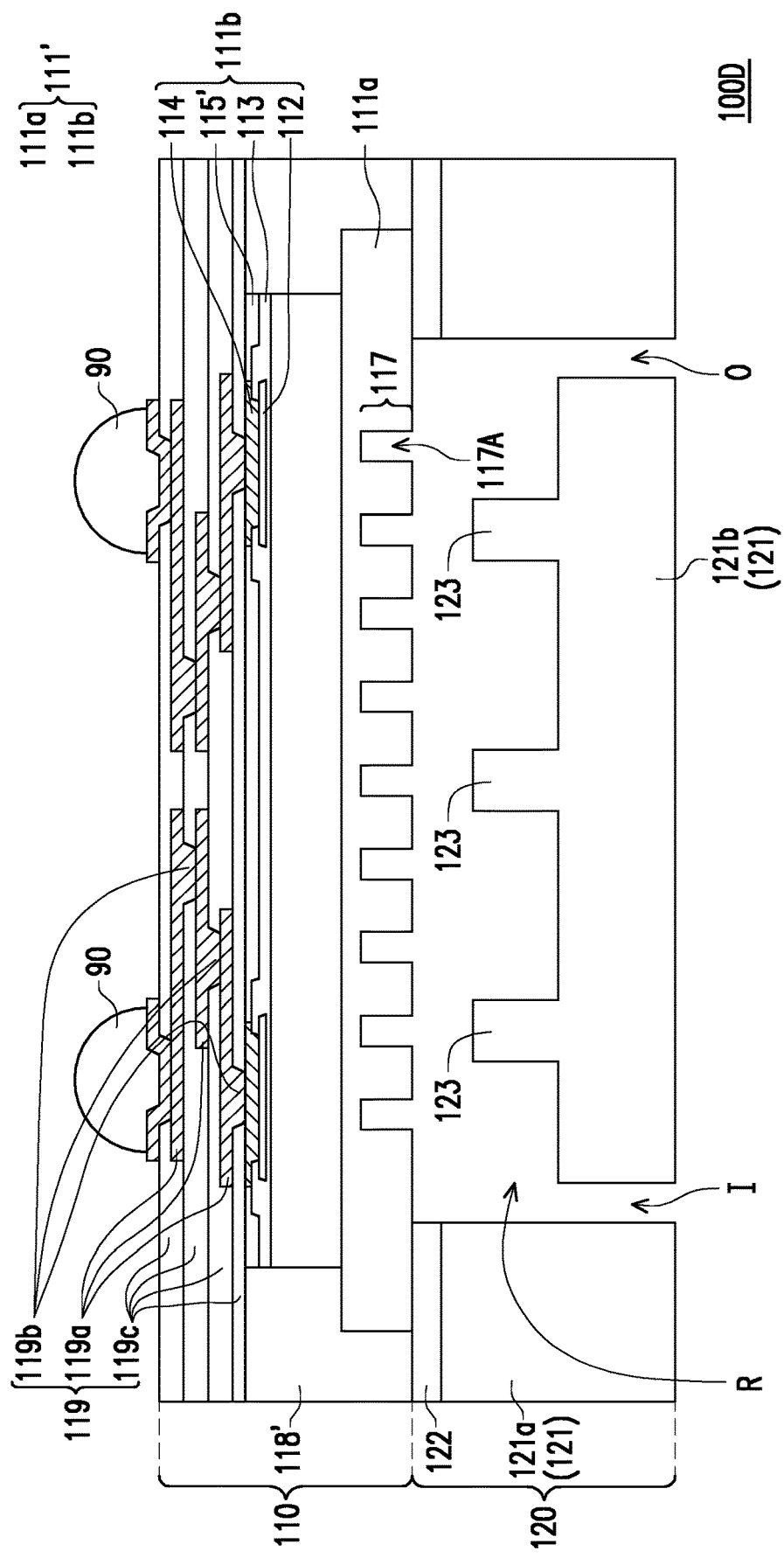

Referring to FIG. 15, in some embodiments, the semiconductor die 111' of the semiconductor device 100D may include a first semiconductor portion 111a and a second semiconductor portion 111b. The second semiconductor portion 111b is disposed on the first semiconductor portion 111a. The thermal enhancement pattern 117 (e.g., the recesses 117A) is formed on the first semiconductor portion 111a. The first semiconductor portion 111a and the second semiconductor portion 111b may or may not be formed by the same material such as the material of the semiconductor die 111 described above. In some embodiments, the first semiconductor portion 111a may be formed by the singulated semiconductor die 111 or the wafer 20 described above. The first semiconductor portion 111a may include the connection pads 112, the passivation layer 113, the conductive pillars 114 and the protection layer 115'. In some embodiments, the second semiconductor portion 111b may be other wafer or other singulated semiconductor dies with or without the functional circuit therein. Then, a chip-to-wafer, a chip-to-chip or a chip-to-wafer bonding technology may be utilized to bond the first semiconductor portion 111a and the second semiconductor portion 111b. In some embodiments, the dimension of the first semiconductor portion 111a is greater than that of the second semiconductor portion 111b. The thermal enhancement pattern 117 (e.g., the recesses 117A) may be formed on the bottom surface of the first semiconductor portion 111a which is away from the second semiconductor portion 111b. Once the first semiconductor portion 111a and the second semiconductor portion 111b are bonded, the procedure referring from FIG. 2 through FIG. 4 and FIG. 6 through FIG. 10 may be performed to fabricate a package of the semiconductor die 111'. In some embodiments, the gap may be formed between the thermal enhancement protrusions 123 and the thermal enhancement pattern 117 (e.g., the recesses 117A) such that the cooling liquid flows in the recess R to further enhance the ability of heat dissipation of the heat spreader 121.

Figure 16:
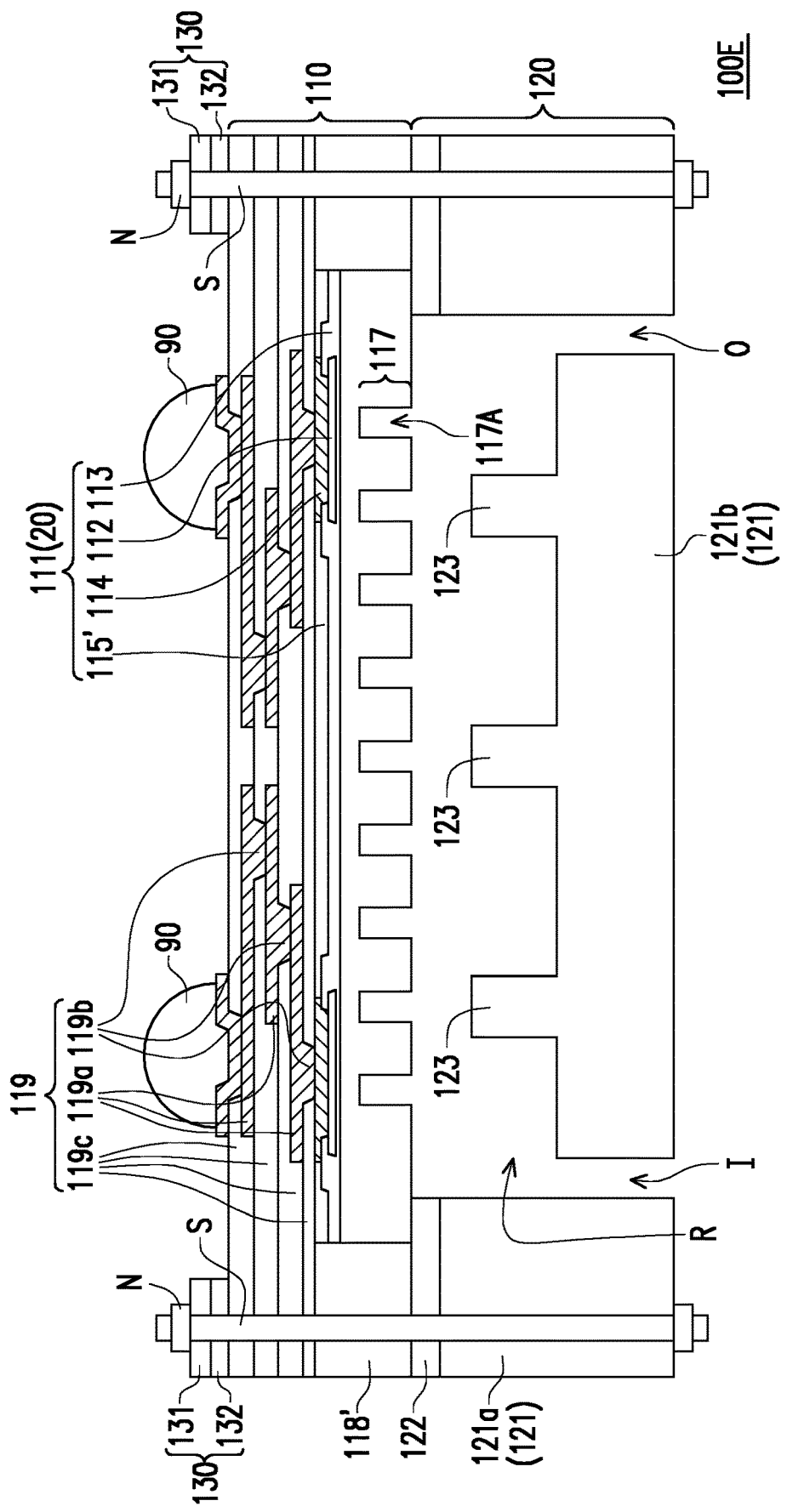

Referring to FIG. 16, in some embodiments, in order to enhance the structural strength of the semiconductor device 100E, after the semiconductor device 100 illustrated in FIG. 10 is formed, a second heat dissipation structure 130 may be further utilized. The second heat dissipation structure 130 may include a heat dissipation portion 131 and a second sealing member 132. The heat dissipation portion 131 may be disposed on a top surface of the chip package 110 opposite to the heat spreader 121. The second sealing member 132 may be disposed between the chip package 110 and the heat dissipation portion 131 such that the first heat dissipation structure 120 and the second heat dissipation structure 130 clamp the chip package 110. The second sealing member 132 serves as stress buffer between the chip package 110 and the heat dissipation portion 130. The second sealing member 132 may prevent the chip package 110 from directly contacting the heat dissipation portion 131 to increase assembly yield rates of the second heat dissipation structure 130. Then, one or more screws S penetrated through the side wall 121a of the first heat dissipation structure 120, the insulating encapsulant 118' of the chip package 110, and the second heat dissipation structure 130. Once the one or more screws S are penetrated, a plurality of nuts N thread in the both ends of the screws S to fasten the semiconductor device 100E. In such way, the chip package 110 may be not easily separate from the first heat dissipation structure 120 and the second heat dissipation structure 130. In certain embodiments, the conductive features 90 of the chip package 110 may be surrounded by and exposed from the second heat dissipation structure 130. The top of the conductive features 90 may be higher than the top of the one or more screws S such that the conductive features 90 may be connected to other external devices. In certain embodiments, the material of the heat dissipation portion 131 and the second sealing member 132 may be or may not be the same as the heat spreader 121 and the first sealing member 122, respectively. In certain embodiments, the heat dissipation portion 131 formed by the material with high thermal conductivity may further enhance the ability of the heat dissipation of the semiconductor device 100E.

Figure 17:
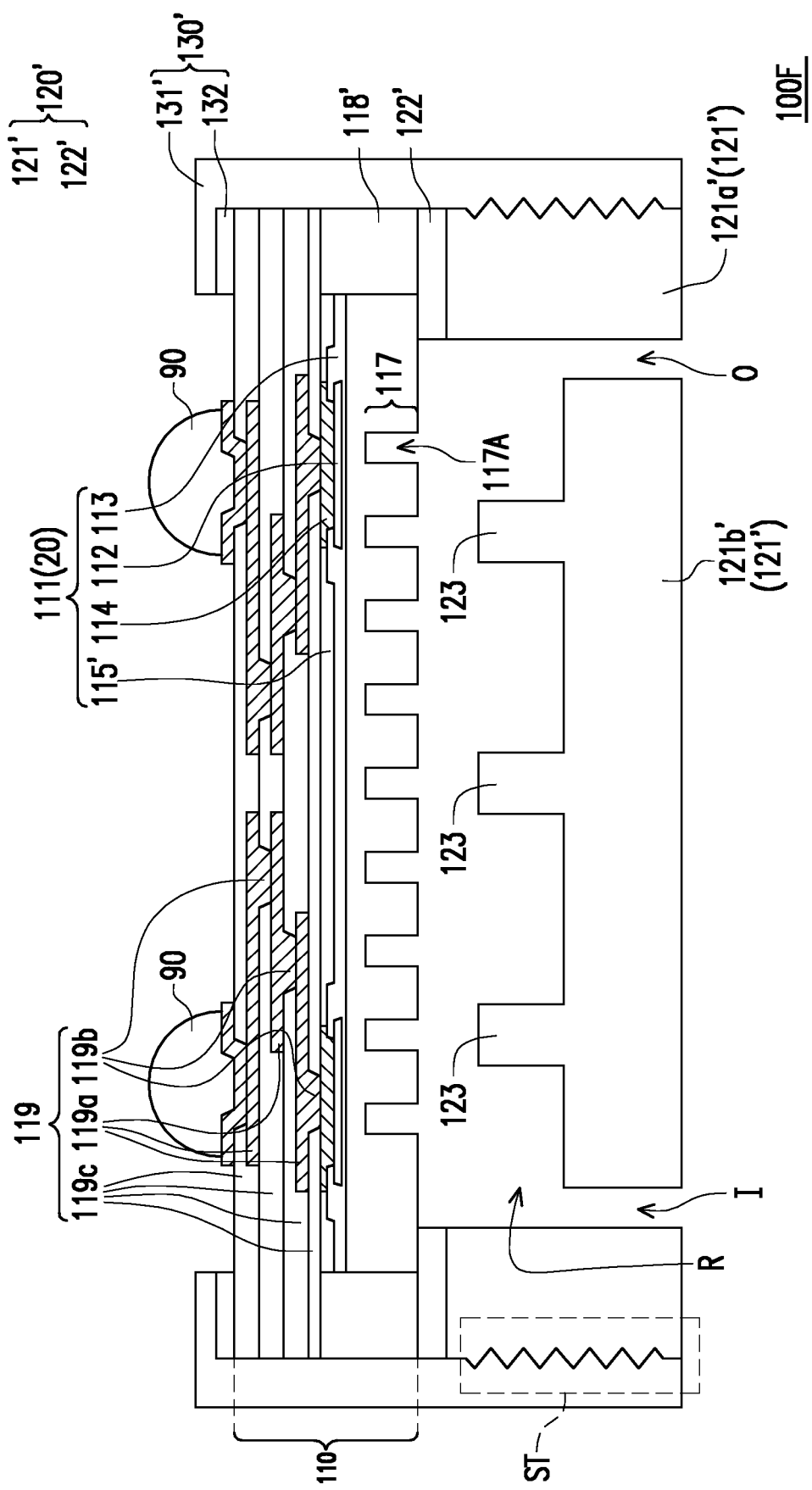

Referring to FIG. 17, in some alternative embodiments of the semiconductor device 100F, the heat spreader 121' includes a side wall 121a' and a bottom wall 121b'. In the case which the wafer 20 may not be singulated or the desired shape of the singulated semiconductor dies 111 may be round shape, the heat dissipation portion 131' and the side wall 121a' of the heat spreader 121' may have corresponding screw threads ST such that the heat dissipation portion 131' and the side wall 121a' of the heat spreader 121' may engage with each other. The first heat dissipation structure 120' and the second heat dissipation structure 130' clamp the chip package 110 into a firm combination situation to increase the assembly yield rate. In certain embodiments, the top of the conductive features 90 may be higher than the top of the second heat dissipation structure 130' such that the conductive features 90 may be connected to other external devices. In certain embodiments, the first sealing member 122' and the second sealing member 132' may prevent the chip package 110 from directly contacting the side wall 121a' of the heat spreader 121' and the heat dissipation portion 131' respectively to increase assembly yield rates of the first heat dissipation structure 120' and the second heat dissipation structure 130'.

Figure 18:
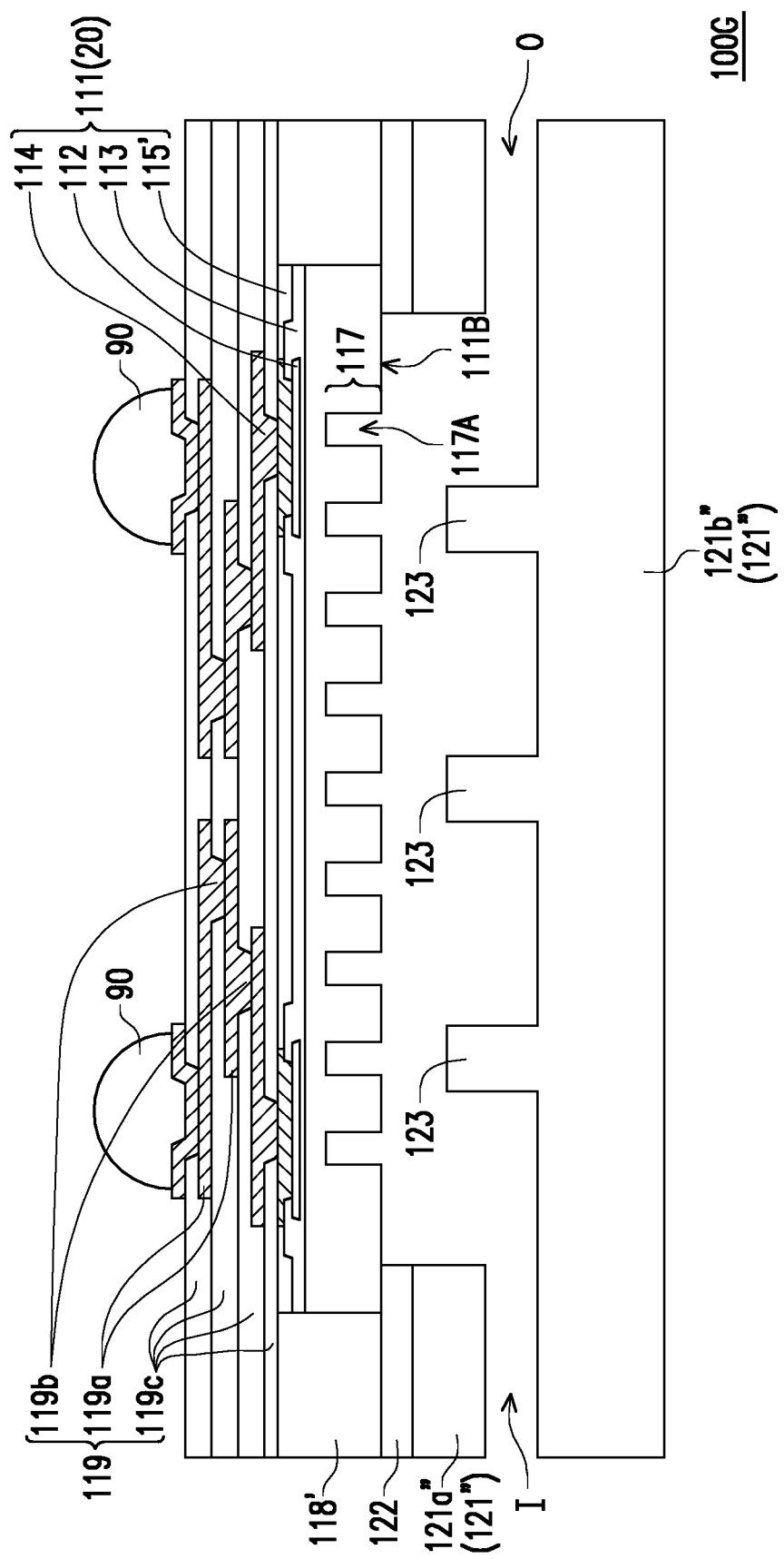

Compared to the semiconductor device 100 as illustrated in FIG. 11, the configuration of the inlet I and the outlet O in the semiconductor device 100G as illustrated in FIG. 18, is different. As shown in FIG. 18, the heat spreader 121" includes a side wall 121a" and a bottom wall 121b", the inlet I and the outlet O of the heat spreader 121" substantially extend and horizontally penetrate through side wall 121a" of the heat spreader 121", for example. In certain embodiments, when the cooling liquid flows through the recess R, the influence of the gravity may decrease such that the cooling liquid may fill the recess R and the thermal enhancement pattern 117 (e.g., the recesses 117A) easily. Accordingly, the heat spreader 121" has stable capability of heat dissipation.

Compared to the semiconductor device 100 as illustrated in FIG. 1, the thermal enhancement protrusions 123' in the semiconductor device 100H may protrude toward and be in contact with the back surface 111B of the semiconductor die 111 or the wafer 20. The physical contact between the semiconductor die 111 or the wafer 20 and thermal enhancement protrusions 123' promotes the efficiency of heat conduction. The thermal enhancement protrusions 123' may serve as the channel wall such that the inlet I and the outlet O communicate with the space between the thermal enhancement protrusions 123'. On the other hand, it should be appreciated that the thermal enhancement protrusions 123' may not cover each of the recesses 117A. In some embodiments, the recesses 117A may be formed as the trench shape and the thermal enhancement protrusions 123' may not fully cover each of the recesses 117A. Thus, when the cooling liquid flows in the recess R, the cooling liquid may flow into the recesses 117A as well.

Figure 19:
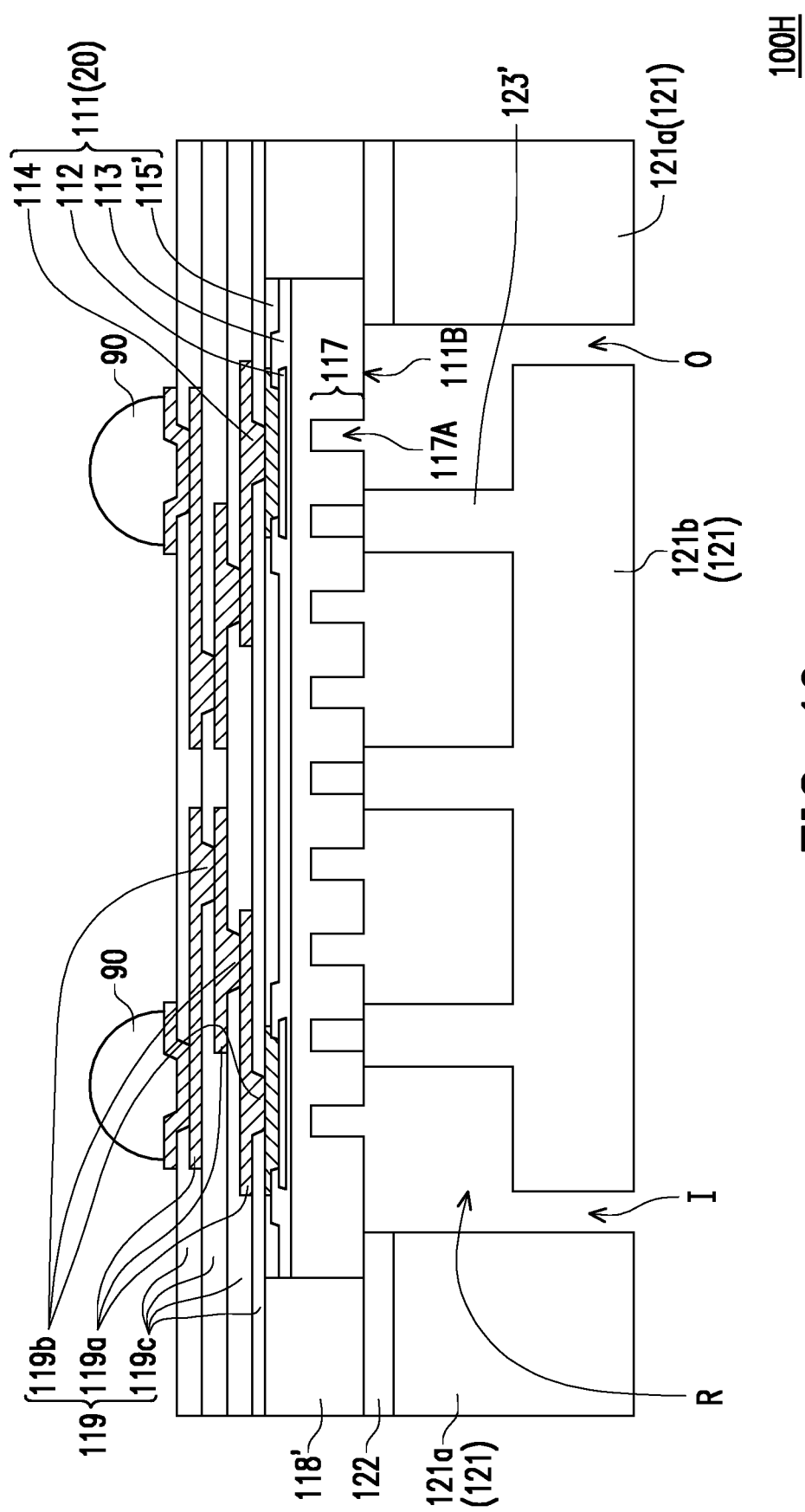
Figure 20B:
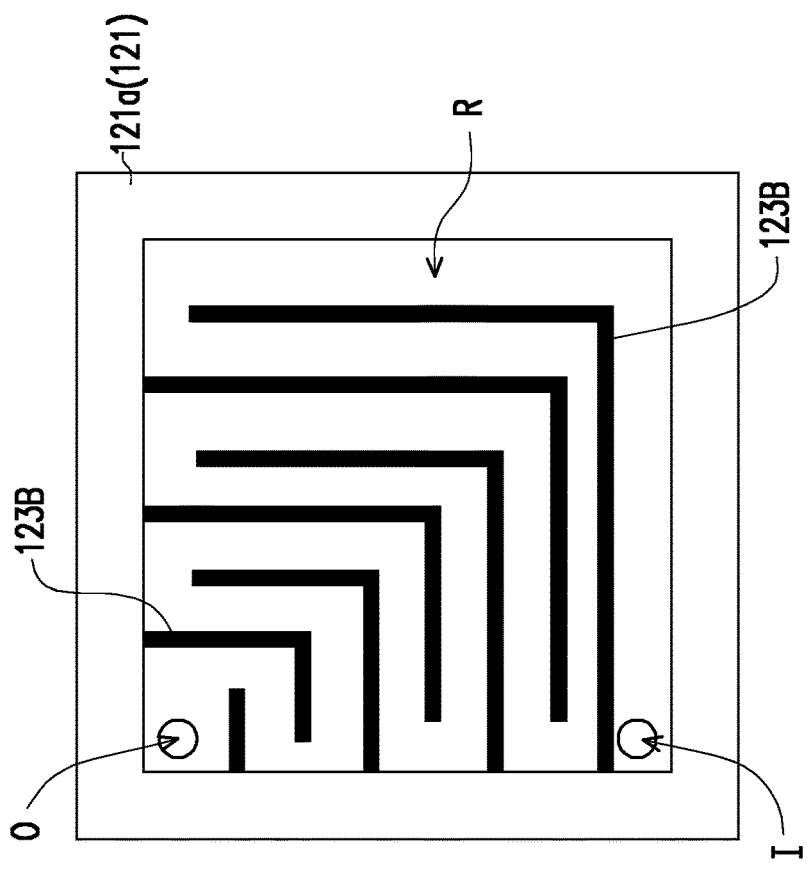
FIGS. 20A and 20B are top views of the heat spreader illustrated in FIG. 19.
Figure 20A:
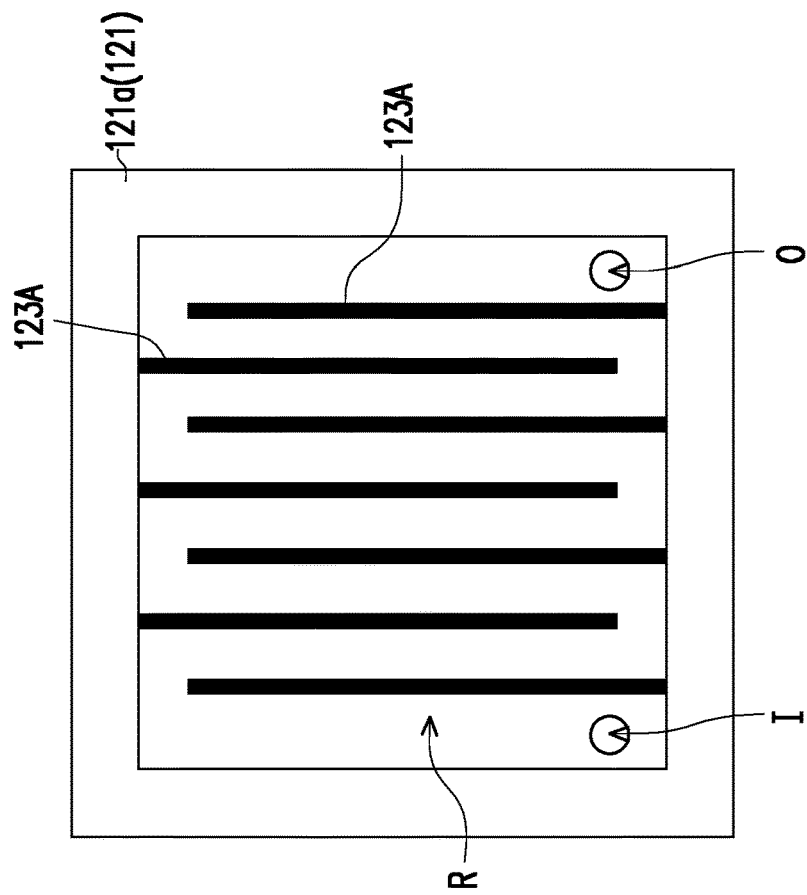

FIGS. 20A and 20B are top views of the heat spreader 121 illustrated in FIG. 19. As shown in FIG. 20A and FIG. 20B, different types of the thermal enhancement protrusions 123A and the thermal enhancement protrusions 123B are illustrated. The thermal enhancement protrusions 123A and the thermal enhancement protrusions 123B are surrounded by the side wall 121a of the heat spreader 121. In such embodiments, the space defined by the thermal enhancement protrusions 123A or 123B serves as the flow channel in which the cooling liquid may flow. Through the thermal enhancement protrusions 123A and the thermal enhancement protrusions 123B, various types of flow channels are defined and the cooling liquid flowing in the flow channel may increase the thermal exchange efficiency of the heat spreader 121.

Furthermore, it should be appreciated that the different characteristics shown in the alternative embodiments (i.e., the characteristics are shown in FIG. 11 through FIG. 19) may combine with each other in accordance with the desired design of the packaging. The first heat dissipation structure 120' and the second heat dissipation structure 130' shown in FIG. 17 and the thermal enhancement protrusions 123' may be utilized simultaneously, for example.

In accordance with some embodiments of the disclosure, a semiconductor device includes a chip package and a heat dissipation structure. The chip package including a semiconductor die is laterally encapsulated by an insulating encapsulant. The semiconductor die has an active surface, a back surface which is opposite to the active surface, and a thermal enhancement pattern on the back surface. A heat dissipation structure is connected to the chip package. The heat dissipation structure includes a heat spreader having a flow channel for a cooling liquid, and the cooling liquid in the flow channel is in contact with the thermal enhancement pattern.

In accordance with some embodiments of the disclosure, a semiconductor device includes a chip package and a heat dissipation structure. The chip package including a semiconductor die is laterally encapsulated by an insulating encapsulant. the semiconductor die has an active surface, a back surface which is opposite to the active surface, and a thermal enhancement pattern on the back surface. The heat dissipation structure includes a first dissipation portion and a second dissipation portion disposed on opposite surfaces of the chip package. The first dissipation portion and the second dissipation portion clamp the chip package. The first dissipation portion of the heat dissipation structure has a flow channel for a cooling liquid, and the cooling liquid in the flow channel is in contact with the thermal enhancement pattern.

In accordance with some embodiments of the disclosure, a method of fabricating a semiconductor device including the following steps is provided. A semiconductor die having an active surface and a back surface which is opposite to the active surface is provided. A thermal enhancement pattern is formed on the back surface of the semiconductor die. An insulating encapsulant laterally encapsulates the semiconductor die to form a chip package. A heat dissipation structure is assembled with the chip package to form a flow channel for a cooling liquid between the heat dissipation structure and the chip package, wherein the cooling liquid in the flow channel is in contact with the thermal enhancement pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a chip package comprising a semiconductor die laterally encapsulated by an insulating encapsulant, the semiconductor die comprising a thermal enhancement pattern; and
   a heat dissipation structure connected to the chip package, the heat dissipation structure comprising a heat spreader comprising a flow channel and a cooling liquid in the flow channel, and the cooling liquid in the flow channel being in contact with the thermal enhancement pattern, wherein outer sidewalls of the heat spreader are substantially aligned with outer sidewalls of the insulating encapsulant.

2. The semiconductor device as claimed in claim 1, wherein the semiconductor die comprises a back surface, and the thermal enhancement pattern comprises at least one recess distributed on the back surface of the semiconductor die.

3. The semiconductor device as claimed in claim 2, further comprising a thermal conductive material on the back surface of the semiconductor die and covering the at least one recess.

4. The semiconductor device as claimed in claim 3, wherein the thermal conductive material is embedded in the at least one recess.

5. The semiconductor device as claimed in claim 3, wherein the thermal conductive material comprises at least one first portion in the at least one recess and at least one second portion located outside the at least one recess.

6. The semiconductor device as claimed in claim 1, wherein the semiconductor die comprises a back surface, and the thermal enhancement pattern comprises at least one protrusion protruding from the back surface of the semiconductor die toward the heat spreader.

7. The semiconductor device as claimed in claim 1, wherein the semiconductor die comprises a first semiconductor portion and a second semiconductor portion disposed on the first semiconductor portion, and the first semiconductor portion comprises the thermal enhancement pattern.

8. The semiconductor device as claimed in claim 1, wherein the heat spreader comprises at least one thermal enhancement protrusion in contact with the semiconductor die.

9. The semiconductor device as claimed in claim 1, wherein the heat spreader comprises at least one thermal enhancement protrusion, and a gap is between the at least one thermal enhancement protrusion and the thermal enhancement pattern.

10. The semiconductor device as claimed in claim 1, wherein the heat spreader further comprises an inlet and an outlet, and the flow channel communicates with the inlet and the outlet.

11. The semiconductor device as claimed in claim 1, wherein the heat dissipation structure further comprises a first sealing member between the chip package and the heat spreader.

12. The semiconductor device as claimed in claim 11, wherein the semiconductor die comprises a back surface and an active surface opposite to the back surface, and the heat dissipation structure further comprises a second sealing member between the chip package and a dissipation portion over the active surface of the semiconductor die.

13. A semiconductor device, comprising:
    a chip package comprising a semiconductor die laterally encapsulated by an insulating encapsulant, the semiconductor die comprising a thermal enhancement pattern; and
    a heat dissipation structure comprising a first dissipation portion and a second dissipation portion disposed on opposite surfaces of the chip package, the first dissipation portion of the heat dissipation structure comprising a flow channel and a cooling liquid in the flow channel, and the cooling liquid in the flow channel being in contact with the thermal enhancement pattern, wherein outer sidewalls of the first dissipation portion are substantially aligned with outer sidewalls of the insulating encapsulant.

14. The semiconductor device as claimed in claim 13, wherein the first dissipation portion and the second dissipation portion are spaced apart by the chip package, and screwed on the chip package through at least one screw passing through the first dissipation portion, the second dissipation portion, and the insulating encapsulant of the chip package.

15. The semiconductor device as claimed in claim 13, wherein the second dissipation portion is disposed on a surface of the chip package and extends along sidewalls of the chip package to engage with the first dissipation portion.

16. The semiconductor device as claimed in claim 13, further comprising a first sealing member between the chip package and the first dissipation portion.

17. The semiconductor device as claimed in claim 16, further comprising a second sealing member between the chip package and the second dissipation portion.

18. A fabricating method of a semiconductor device, comprising:
    providing a semiconductor die having a thermal enhancement pattern;
    laterally encapsulating the semiconductor die by an insulating encapsulant to form a chip package; and
    assembling a heat dissipation structure with the chip package to form a flow channel between the heat dissipation structure and the chip package such that outer sidewalls of the heat dissipation structure are substantially aligned with outer sidewalls of the insulating encapsulant.

19. The method as claimed in claim 18, wherein the thermal enhancement pattern is formed on a back surface of the semiconductor die through an etching process.

20. The method as claimed in claim 19, further comprising:
forming a thermal conductive material on the back surface of the semiconductor die to cover the thermal enhancement pattern.

* * * * *